United States Patent [19]
Kidoguchi et al.

[11] Patent Number: 5,956,572
[45] Date of Patent: Sep. 21, 1999

[54] METHOD OF FABRICATING INTEGRATED THIN FILM SOLAR CELLS

[75] Inventors: Susumu Kidoguchi, Kitakatsuragi-gun; Akimasa Umemoto, Sakurai, both of Japan

[73] Assignee: Sharp Kabushiki Kaisha, Osaka, Japan

[21] Appl. No.: 08/917,105

[22] Filed: Aug. 25, 1997

[30] Foreign Application Priority Data

Aug. 26, 1996 [JP] Japan ..................................... 8-223472

[51] Int. Cl.$^6$ .................................................. H01L 21/00
[52] U.S. Cl. .................. 438/96; 438/98; 438/940
[58] Field of Search .............. 257/53; 136/258, 136/244; 438/96, 940, 98

[56] References Cited

U.S. PATENT DOCUMENTS

| | | | |
|---|---|---|---|
| 5,147,468 | 9/1992 | Deguchi | 136/244 |
| 5,217,921 | 6/1993 | Kaido et al. | 437/173 |
| 5,236,516 | 8/1993 | Noguchi et al. | 136/246 |
| 5,527,716 | 6/1996 | Kusian et al. | 437/4 |

FOREIGN PATENT DOCUMENTS

| | | |
|---|---|---|
| 63-3470 | 1/1988 | Japan . |
| 2-43776 | 2/1990 | Japan . |

*Primary Examiner*—Brian Dutton
*Attorney, Agent, or Firm*—Nixon & Vanderhye P.C.

[57] ABSTRACT

A method is provided for fabricating solar cells. A transparent conductive film is formed on a transparent substrate having an insulative surface and the transparent conductive film is segmented by a first scribing step to form transparent conductive film electrodes. An amorphous semiconductor layer is formed on the resulting substrate having the transparent conductive film electrodes. The amorphous semiconductor layer is segmented by a second scribing step to form amorphous semiconductor photoelectric conversion layers. A rear electrode layer is formed on the resulting substrate having the amorphous semiconductor photoelectric conversion layers and this rear electrode layer is segmented by a third scribing step to form rear electrodes. The third scribing step includes forming a resist film on the rear electrode layer, forming trenches in the resist film by laser scribing and etching off portions of the rear electrode layer with an etchant by using the resulting resist film as a mask.

17 Claims, 6 Drawing Sheets

METHOD OF FABRICATING INTEGRATED THIN FILM SOLAR CELLS

BACKGROUND OF THE INVENTION

1. Field of the Invention

The present invention relates to a method of fabricating integrated thin film solar cells. More particularly, it relates to a method of fabricating integrated thin film solar cells preventing the quality degradation of photoelectric conversion and the loss in the effective power generation area.

2. Description of the Prior Art

Integrated thin film solar cells typically each include an amorphous semiconductor photoelectric conversion layer formed on a transparent substrate having an insulative surface, and provide for ready power generation at a predetermined voltage. A conventional process for fabricating integrated thin film solar cells is disclosed, for example, in Japanese Unexamined Patent Publication No. Sho 63(1988)-3470, in which a thin film formation step and a scribing step are repeatedly performed. This conventional fabrication method will be described with reference to FIG. 4(a) to FIG. 4(c).

As shown in FIG. 4(a), a transparent conductive film is deposited on a transparent substrate 1 such as a glass substrate having an insulative surface by evaporation, CVD (chemical vapor deposition) or sputtering method. The transparent conductive film is segmented into a plurality of elongate transparent conductive film electrodes 3 for isolation of unit cells through a laser scribing method by irradiating the transparent conductive film with a laser beam 11. This step is called a first scribing step, and trenches formed through the first scribing step are called first scribe lines. Thus, the plurality of elongate transparent conductive film electrodes 3 are formed on the surface of the substrate 1.

As shown in FIG. 4(b), an amorphous semiconductor layer is deposited on the surface of the resulting substrate 1 by CVD. Trenches are formed in the amorphous semiconductor layer along lines extending parallel to and adjacent to the first scribe lines through the laser scribing method by irradiating the amorphous semiconductor layer with a laser beam 12 keeping the underlying transparent conductive film electrodes 3 intact. This step is called a second scribing step, and the trenches formed through the second scribing step are called second scribe lines. Thus, the amorphous semiconductor layer is segmented into a plurality of amorphous semiconductor photoelectric conversion layers 4 for the respective cells as shown in FIG. 4(b).

As shown in FIG. 4(c), a rear electrode layer is deposited on the resulting substrate (i.e., on the amorphous semiconductor photoelectric conversion layer 4 and in the second scribed lines). Then, trenches are formed in the rear electrode layer along lines respectively extending parallel to and adjacent to the second scribe lines on sides thereof opposite to the first scribe lines through the laser scribing method. This step is called a third scribing step, and the trenches formed through the third scribing step are called third scribe lines. In the third scribing step, the rear electrode layer is segmented into a plurality of elongate rear electrodes 10 for the respective unit cells which, in turn, are connected in series.

In the third scribing step, the laser scribing method enables the third scribe lines to be each spaced a reduced distance from an adjacent second scribe line, making it possible to reduce a loss in the effective power generation area of the overall integrated cell module.

In the laser scribing method, however, a surface portion of the amorphous semiconductor photoelectric conversion layer 4 is liable to be crystallized by the irradiation with the laser beam thereby to have a reduced specific resistance when the trenches are formed selectively in the rear electrode layer. This may result in a current leakage. Alternatively, the trenches may be formed simultaneously in the rear electrode layer and in the amorphous semiconductor layer by the laser scribing method. However, scribe dust of the rear electrode layer may cause a short circuit between the rear electrode 10 and the transparent conductive film electrode 3, thereby causing a current leakage. In either of the cases, the shunt resistance is reduced, resulting in a reduced yield.

In the third scribing step, the isolation of the unit cells may be achieved simultaneously with the formation of the rear electrode 10 by evaporation or sputtering with the use of a metal mask.

Where the sputtering method or the like is employed, however, edge portions of the metal mask used for the formation of the rear electrode 10 damage the amorphous semiconductor photoelectric conversion layers 4, thereby causing current leakage and reducing the conversion efficiency. Further, to prevent a patterning failure due to vapor diffusion during the evaporation, an isolation region having a greater width should be provided between each adjacent pair of rear electrodes 10, resulting in a greater loss in the effective power generation area.

In the third scribing step, the segmentation of the rear electrode layer 10a may otherwise be achieved by first applying a resist over the substrate by a printing method to form a resist film 7, then patterning the resist film 7 as shown in FIG. 5(a), and etching off portions of the rear electrode layer 10a with a liquid etchant to form a rear electrode 10 as shown in FIG. 5(b).

This method ensures reliable segmentation of the rear electrode layer 10a, but suffers the limitation of the printing accuracy so that the loss in the effective power generation area of the integrated cell module is increased.

SUMMARY OF THE INVENTION

The present invention provides a method of fabricating integrated thin film solar cells, which comprises:

a step for forming a transparent conductive film on a transparent substrate having an insulative surface;

a first scribing step for segmenting the transparent conductive film to form transparent conductive film electrodes;

a step for forming an amorphous semiconductor layer on the resulting substrate having the transparent conductive film electrodes;

a second scribing step for segmenting the amorphous semiconductor layer to form amorphous semiconductor photoelectric conversion layers;

a step for forming a rear electrode layer on the resulting substrate having the amorphous semiconductor photoelectric conversion layers; and a third scribing step for segmenting the rear electrode layer to form rear electrodes;

wherein the third scribing step includes forming a resist film on the rear electrode layer, forming trenches in the resist film by laser scribing, and etching off portions of the rear electrode layer with an etchant by using the resulting resist film as a mask.

DETAILED DESCRIPTION OF THE PREFERRED EMBODIMENT

Figure 1:
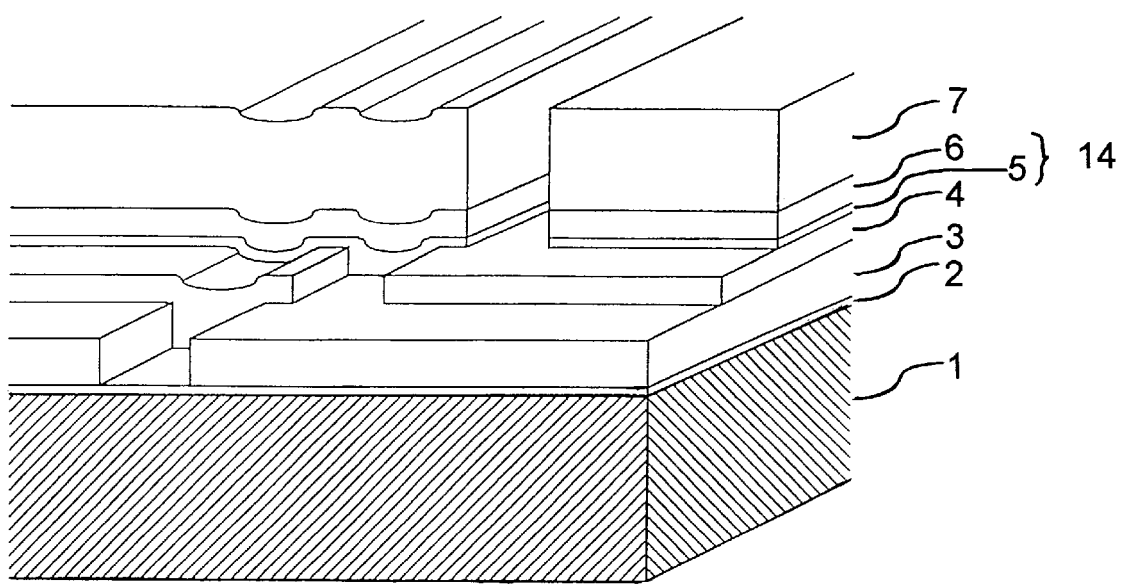
FIG. 1 is a schematic perspective view partially in section illustrating integrated thin film solar cells according to the present invention.

Integrated thin film solar cells to be fabricated in accordance with the fabrication method of the present invention essentially each include transparent conductive film electrodes, amorphous semiconductor photoelectric conversion layers and rear electrodes which are provided in this order on a transparent substrate.

The transparent substrate according to the present invention has an insulative surface, and examples thereof include a glass substrate and resin substrates such as of polyethylene and polycarbonate. The transparent substrate is subjected to a predetermined surface texturing treatment so that emitted light can be scattered on the surface of the transparent substrate. The texturing treatment is achieved by any of various conventional methods such as sand blasting and laser beam radiation. The transparent substrate preferably has a thickness of about 0.1 mm to about 10 mm, a refractive index of about 0.5 to about 2.5 and a light transmittance of about 60% to about 100%, for example. The transparent substrate may be formed with an insulative film such as of silicon dioxide on its surface.

The transparent conductive film is deposited on the transparent substrate. The material for the transparent conductive film is not particularly limited, as long as the material is an electrically conductive material having a light transmittance of about 80% or higher. Examples thereof include ITO, zinc oxide and $SnO_2$. The transparent conductive film is deposited to a thickness of about 0.1 $\mu$m to about 100 $\mu$m on the substrate by any of various conventional methods such as atmospheric CVD, vacuum CVD, plasma CVD, sputtering and evaporation method. Where an $SnO_2$ film is to be formed by the atmospheric CVD, for example, tin chloride, hydrogen fluoride and steam are supplied at flow rates of about 100,000 sccm to about 500,000 sccm, about 500 sccm to about 3,000 sccm and about 50 sccm to about 500 sccm, respectively, while the substrate is maintained at a temperature not higher than the melting point of the substrate material, preferably at a temperature of 600° C. or lower.

The transparent conductive film is segmented by a first scribing step to form the transparent conductive film electrodes. The scribing of the transparent conductive film is achieved by irradiating the transparent conductive film with any of various types of lasers such as Nd:YAG laser with any wavelength at an intensity such that the transparent substrate and the insulative film formed thereon are not damaged thereby but only the transparent conductive film is segmented. The wavelength and intensity of the laser beam are controlled depending on the material for and the thickness of the transparent conductive film layer. Where an about 1-$\mu$m thick $SnO_2$ film is formed as the transparent conductive film, for example, the wavelength and intensity of the laser beam are preferably about 800 nm to about 1400 nm, and about $2\times10^4$ W/cm$^2$ to about $5\times10^5$ W/cm$^2$, respectively. The segmentation of the transparent conductive film is preferably carried out in such a manner that the resulting transparent conductive film electrodes are arranged into a matrix pattern or in a stripe pattern.

The amorphous semiconductor layer is deposited on the resulting substrate. The amorphous semiconductor layer preferably includes semiconductor layers comprising a p-layer, an i-layer and an n-layer formed in this order over the transparent conductive film electrodes. This ensures that the resulting cells have relatively good photoelectric conversion characteristics. The amorphous semiconductor layer may have a structure other than the pin structure. Further, where a single cell structure is employed, a single stack consisting of the p-layer, the i-layer and the n-layer may be provided as the amorphous semiconductor layer. Alternatively, a tandem structure may be employed in which the pin structure layers are stacked. It is preferred that these semiconductor layers are all amorphous, but the i-layer and the n-layer may be crystalline if at least the p-layer is amorphous. These amorphous semiconductor layers are formed, for example, of silicon, SiC, SiGe, SiSn or the like. The p-layer and the n-layer preferably contain a p-type impurity such as boron and an n-type impurity such as phosphorus or arsenic, respectively, in a concentration of about $10^{18}$ cm$^{-3}$ to about $10^{20}$ cm$^{-3}$. The formation of the player, the i-layer and the n-layer is achieved by any of conventional methods such as atmospheric CVD, vacuum CVD and plasma CVD method. The thicknesses of the p-layer, the i-layer and the n-layer are about 7 nm to about 12 nm, about 200 nm to about 600 nm and about 20 nm to about 100 nm, respectively, with a total thickness of about 200 nm to about 700 nm. The conditions (i.e., frequency, material gas, supply rate, dilution ratio of material gas with hydrogen gas, film formation (RF) energy, film formation temperature and the like) for the CVD method are properly selected.

More specifically, for the formation of the p-layer, a dopant gas such as diborane is supplied at a flow rate of 1 sccm to 100 sccm with the substrate kept at about 150° C. to about 350° C., while a silane gas such as monosilane or disilane and hydrogen gas are supplied at a flow rate ratio of about 3 to about 300 sccm: about 15 to about 1500 sccm. For the formation of the i-layer, a silane gas as described above and hydrogen gas are supplied at a flow rate ratio of about 6 to about 600 sccm: about 2 to about 200 sccm. For the formation of the n-layer, a dopant gas such as phosphine gas is supplied at a flow rate of about 1 sccm to about 100 sccm, while a silane gas as described above and hydrogen gas are supplied at a flow rate ratio of about 6 to about 600 sccm: about 0.3 to about 30 sccm.

The amorphous semiconductor layer is segmented by a second scribing step to form amorphous semiconductor photoelectric conversion layers. The scribing of the amorphous semiconductor layer is achieved by irradiating the amorphous semiconductor layer with any of various types of lasers such as Nd:YAG laser and excimer laser with any wavelength at an intensity such that only the amorphous semiconductor layer is segmented with the transparent conductive film electrodes and the like kept intact. The Nd:YAG laser is advantageous from an industrial viewpoint because of easy maintenance and low maintenance costs. The wavelength and intensity of the laser beam are controlled depending on the material for and the thickness of the amorphous semiconductor photoelectric conversion layer. Where the amorphous semiconductor photoelectric conversion layer is formed of silicon and has a thickness of about 500 nm, for example, the wavelength and intensity of the laser beam are preferably about 400 nm to about 800 nm, and about $2 \times 10^3$ $W/cm^2$ to about $5 \times 10^4$ $W/cm^2$, respectively. For segmentation of the amorphous semiconductor layer, scribe lines are preferably formed therein in an offset relation with respect to the scribe lines formed through the first scribing step.

The rear electrode layer is deposited on the resulting substrate. The rear electrode layer preferably comprises a transparent conductive film and a metal reflection film formed in this order over the photoelectric conversion layers to ensure effective utilization of light. The transparent conductive film preferably has a thickness of about 20 nm to about 100 nm, and is formed of the same material and in the same manner as the transparent conductive film described above. The material for the metal reflection film is not particularly limited, but examples thereof include silver and aluminum. The formation of the metal reflection film is achieved by any of conventional methods such as sputtering and evaporation method, and the thickness of the metal reflection film is preferably about 300 nm to about 800 nm.

The rear electrode layer is segmented by a third scribing step to form rear electrodes. More specifically, a resist film is formed on the rear electrode layer and irradiated with a laser beam for formation of trenches therein. Then, portions of the rear electrode layer are etched off with an etchant by using the resist film as a mask.

The material for the resist film is not particularly limited, but may be a resist material commonly used for wet etching.

One exemplary resist is a petroleum pitch plating resist having an acid- and alkali-resistance. The resist material is applied on the rear electrode layer by a conventional method such as screen printing, spray coating and spin coating method for formation of the resist film. Where the screen printing method is employed, for example, the viscosity of the resist material is adjusted to about 1,000 cp to about 100,000 cp, and the resist material is applied to a thickness of about 20 µm to about 100 µm, preferably about 30 µm to about 50 µm. Where the spray coating method or the spin coating method is employed, the viscosity of the resist material may be reduced for formation of a resist film having a reduced thickness. The spray coating method and the spin coating method are particularly preferred, because these methods allow for formation of a thinner resist film thereby to reduce the amount of the resist material to be used. In addition, the amount of a solvent to be used for lifting off the resist film can be reduced thereby to reduce the burden of waste water treatment.

The formation of the trenches in the resist film is achieved by irradiating the resist film with any of various types of lasers such as Nd:YAG laser and excimer laser with any wavelength at an intensity such that the trenches are formed only in the resist film with the underlying rear electrode layer and the like kept intact. The wavelength and intensity of the laser is properly controlled depending on the material for and the thickness of the resist film and the material for the metal reflection film of the rear electrode layer. Where the resist film is formed of a petroleum pitch plating resist and has a thickness of about 40 µm and the metal reflection film is formed of silver, for example, the wavelength of the laser is preferably about 0.45 µm or greater, preferably about 0.45 µm to about 0.8 µm, and the intensity is preferably about $2 \times 10^3$ $W/cm^2$ to about $5 \times 10^4$ $W/cm^2$. Where the metal reflection film is formed of aluminum, the wavelength of the laser is preferably about 0.10 µm or greater, preferably about 0.10 µm to about 0.8 µm, and the intensity is preferably about $2 \times 10^3$ $W/cm^2$ to about $5 \times 10^4$ $W/cm^2$. The trenches are preferably formed so as to be located adjacent to trenches formed through the second scribing step on a side thereof opposite to trenches formed by the first scribing step.

By using as a mask the resist film formed with the trenches, portions of the rear electrode layer are etched off with an etchant for patterning thereof. The etchant to be used is not particularly limited, but should be capable of etching both the transparent conductive film and the metal reflection film constituting the rear electrode. Examples of specific etchants include SC1 (containing 31% hydrogen peroxide solution, 30% ammonia aqueous solution and water in a ratio of 1:1:10) and the etching process time is typically about 10 seconds to about 5 minutes.

Processes for fabricating integrated thin film solar cells according to the present invention will hereinafter be described with reference to the drawings.

EMBODIMENT 1

Figure 4A:
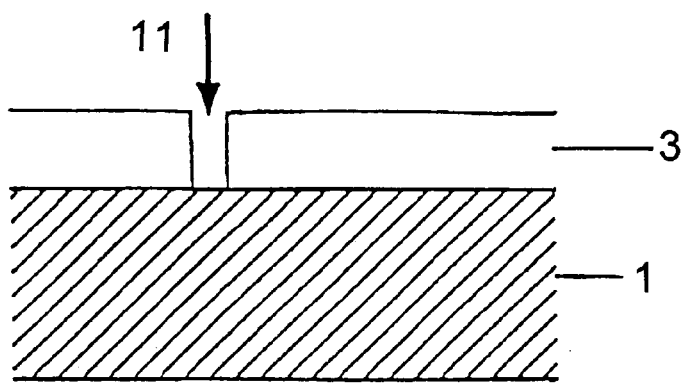
FIG. 4(a) to FIG. 4(c) are schematic sectional views for explaining a conventional method of fabricating integrated thin film solar cells.
Figure 4B:
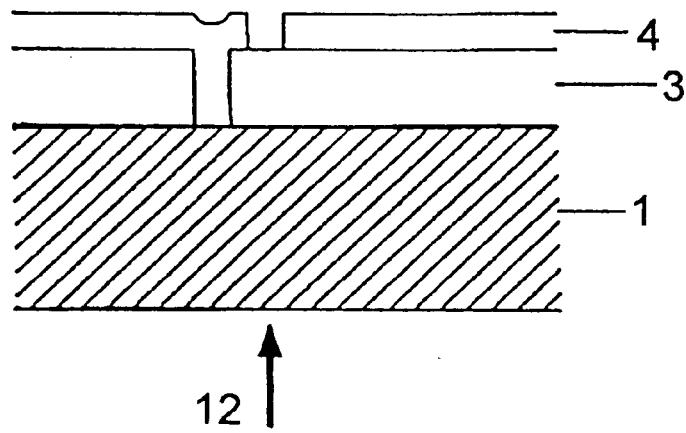
Figure 4C:
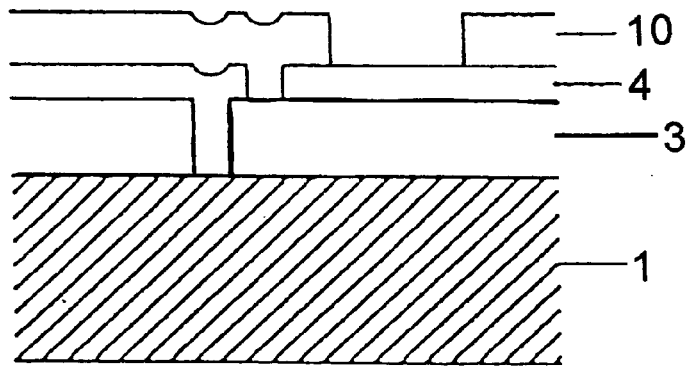
Figure 5A:
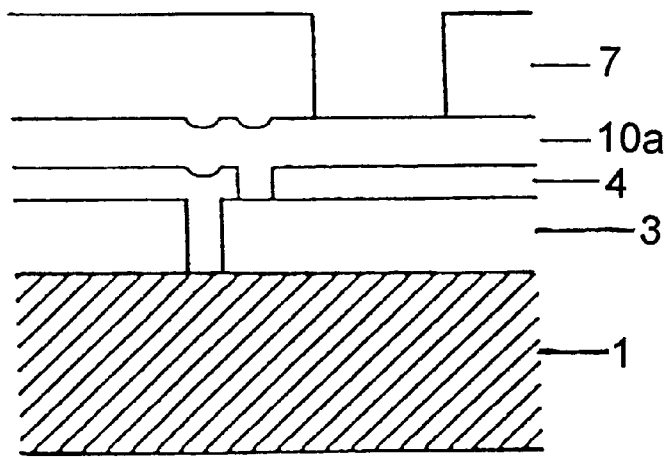
FIG. 5(a) and FIG. 5(b) are schematic sectional views for explaining another conventional method of fabricating integrated thin film solar cells.
Figure 5B:
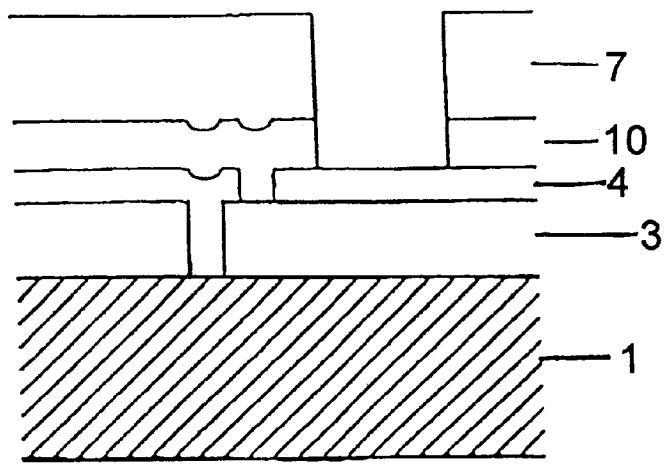

A first embodiment of the present invention will be explained with reference to FIGS. 1 and 2. FIG. 1 is a schematic perspective view partially in section illustrating integrated thin film solar cells of a single cell structure fabricated in accordance with a fabrication method of the first embodiment of the present invention. FIGS. 2(a) to 2(i) are schematic sectional views for explaining the fabrication method. In FIGS. 1, 2 and 4, like reference numerals denote like parts.

Figure 2A:
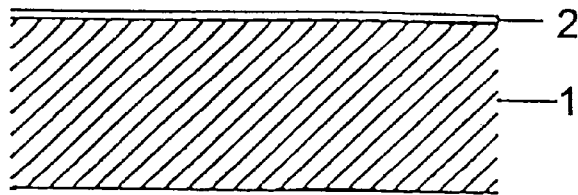
FIG. 2(a) to FIG. 2(i) are schematic sectional views for explaining a method of fabricating the integrated thin film solar cells according to the present invention.

A glass substrate having a thickness of 1 mm and a refractive index of 1.5 is used as a transparent substrate 1 having an insulative surface. With the substrate 1 kept at 500° C., silicon dioxide ($SiO_2$) having a refractive index of 1.5 is deposited to a thickness of 100 nm on the substrate 1 by atmospheric CVD method, as shown in FIG. 2(a), for formation of a silicon dioxide film 2.

Figure 2B:
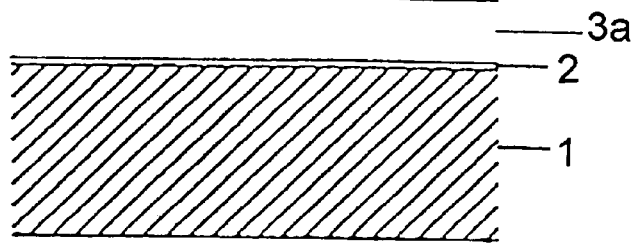

As shown in FIG. 2(b), a transparent conductive film 3a is formed on the silicon dioxide film 2 for formation of transparent conductive film electrodes 3. For the formation of the transparent conductive film 3a, tin dioxide ($SnO_2$) is deposited to a thickness of 1 µm by atmospheric CVD method in such a manner that the transparent conductive film 3a has a textured surface with a haze ratio of 12% to 15%. For the deposition of tin dioxide, tin tetrachloride ($SnCl_4$) gas as a material gas, hydrogen fluoride (HF) gas as a dopant gas and steam ($H_2O$) for oxidation of tin tetrachloride are supplied at flow rates of 250,000 sccm, 1,000 sccm and 200 sccm, respectively. At this time, the substrate 1 is kept at 500° C., and the transparent conductive film has a sheet resistance of 9Ω/□.

Figure 2C:
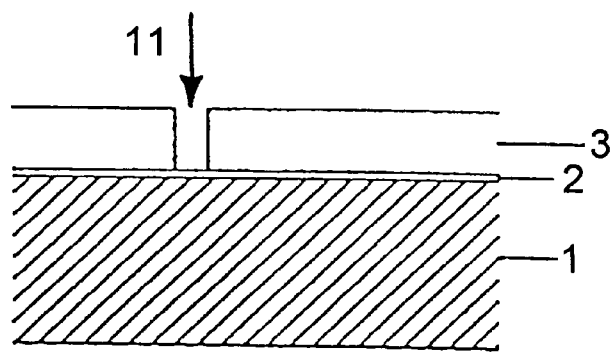

The transparent conductive film 3a is segmented into a plurality of elongate transparent conductive film electrodes 3, as shown in FIG. 2(c), by the first scribing step utilizing the laser scribing method. Thus, unit cells are isolated from each other. In this embodiment, the transparent conductive film 3a is irradiated with a laser beam 11 of fundamental harmonic generation (having a wavelength of 1.06 µm) from Nd:YAG laser so as to be formed with trenches as first scribe lines for the segmentation of the transparent conductive film 3a.

Figure 2D:
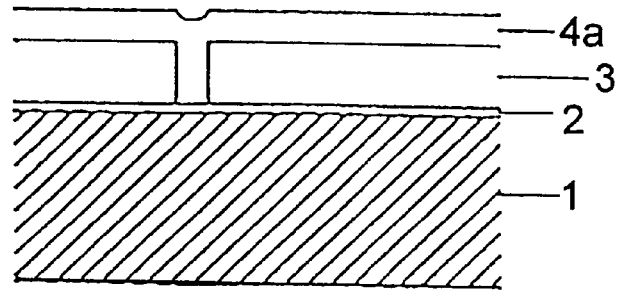

As shown in FIG. 2(d), an amorphous semiconductor layer 4a is formed on the resulting substrate. For the formation of the amorphous semiconductor layer 4a, a 12-nm thick p-layer is first formed of an amorphous semiconductor by means of a plasma CVD apparatus (not shown). With the substrate 1 kept at 200° C., monosilane ($SiH_4$) gas, methane ($CH_4$) gas and hydrogen ($H_2$) gas are supplied as reactant gases into the plasma CVD apparatus at flow rates of 30 sccm, 89 sccm and 150 sccm, respectively, while diborane ($B_2H_6$) gas diluted into a concentration of 1% with hydrogen gas is supplied as a dopant gas at a flow rate of 10 sccm.

In turn, a 400-nm thick i-layer is formed on the resulting substrate by means of the plasma CVD apparatus. With the substrate 1 kept at 200° C., monosilane ($SiH_4$) gas and hydrogen gas are supplied as reactant gases into the plasma CVD apparatus at flow rates of 60 sccm and 20 sccm, respectively.

Then, a 100-nm thick n-layer is formed by means of the plasma CVD apparatus. With the substrate 1 kept at 200° C., monosilane ($SiH_4$) gas and hydrogen ($H_2$) gas are supplied as reactant gases into the plasma CVD apparatus at flow rates of 60 sccm and 3 sccm, respectively, while phosphine ($PH_3$) gas diluted into a concentration of 0.3% with hydrogen ($H_2$) gas is supplied as a dopant gas at a flow rate of 18 sccm. Thus, the formation of the amorphous semiconductor layer 4a is completed as shown in FIG. 2(d).

Figure 2E:
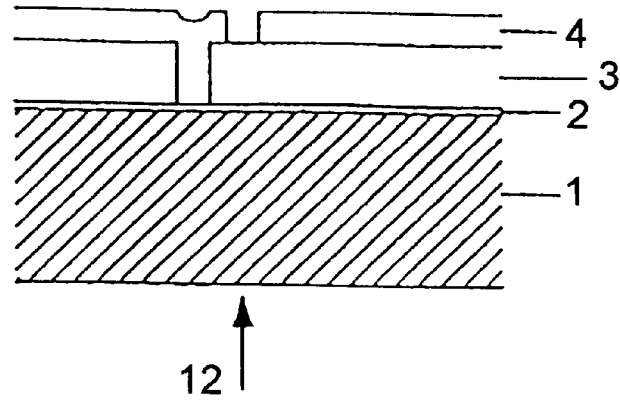

Subsequently, the amorphous semiconductor layer 4a is segmented into a plurality of amorphous semiconductor photoelectric conversion layers 4 for the respective cells through the second scribing step by applying a laser beam along lines extending parallel to and adjacent to the first scribe lines as shown in FIG. 2(e). In this embodiment, the amorphous semiconductor layer 4a is irradiated with a laser beam 12 of secondary harmonic generation (SHG having a wavelength of 0.532 $\mu$m) from Nd:YAG laser so as to be formed with trenches as second scribe lines for segmentation of the amorphous semiconductor photoelectric conversion layer 4.

Figure 2F:
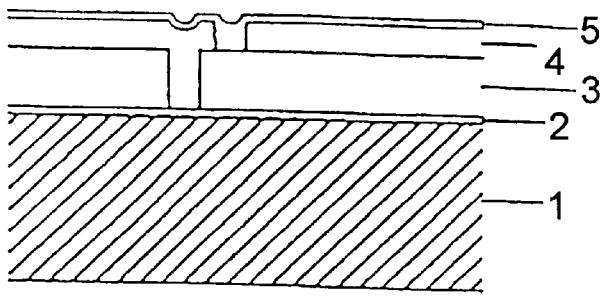

In turn, zinc oxide (ZnO) is deposited to a thickness of 50 nm on the resulting substrate by sputtering method for formation of a transparent conductive film 5 as shown in FIG. 2(f).

Figure 2G:
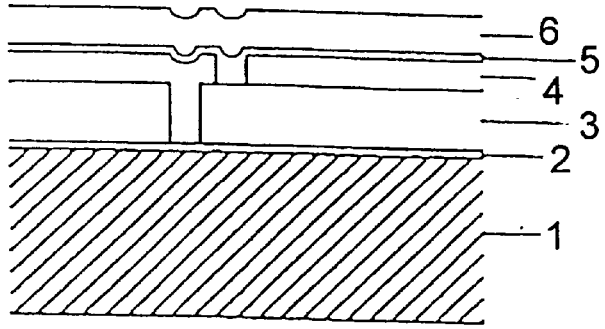

As shown in FIG. 2(g), silver (Ag) is deposited to a thickness of 500 nm on the resulting substrate by sputtering for formation of a rear metal reflection film 6.

The transparent conductive film 5 and the rear metal reflection film 6 constitute a rear electrode layer, which is thereafter segmented into a plurality of rear electrodes 14 for the respective cells. The rear metal reflection film 6 serves to reflect light back into the photoelectric conversion layers 4, ensuring effective utilization of light.

Figure 2H:
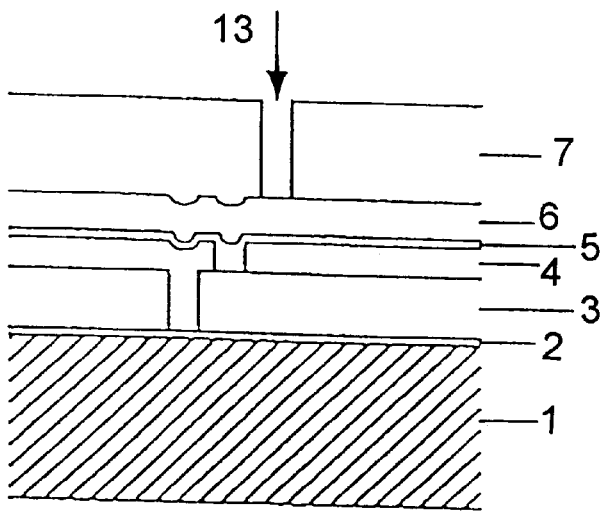

In turn, the third scribing step is performed. As shown in FIG. 2(h), a resist film 7 is formed of a petroleum pitch plating resist on the resulting substrate 1. The resist is applied to a thickness of 40 $\mu$m over the surface of the substrate 1 formed with the metal reflection film 6 by screen printing method under conditions such that the photoelectric conversion layers 4 are not physically damaged. The resist has a viscosity of about 1,000 cp to about 100,000 cp.

In turn, a laser beam 13 of secondary harmonic generation (SHG having a wavelength of 0.532 $\mu$m) from Q-switch oscillation Nd:YAG laser is emitted onto the resist film 7 along lines respectively extending parallel to and adjacent to the second scribe lines on sides thereof opposite to the first scribe lines at an oscillation frequency of 5 kHz at a laser emission speed of 40 mm/sec at a process face output of 150 W/mm$^2$ for formation of trenches in the resist film 7.

By controlling the wavelength of the laser beam 13 at 0.45 $\mu$m or greater, the laser beam 13 can be reflected on the rear metal reflection film 6 at a reflectivity of higher than 90%. This suppresses the influence of the laser beam 13 on the photoelectric conversion layers 4 and the local heating of the rear metal reflection film 6 and the photoelectric conversion layer 4.

Subsequently, portions of the transparent conductive film 5 of zinc oxide (ZnO) and the rear metal reflection film 6 of silver (Ag) are etched off with an etchant (SC1) containing 31% hydrogen peroxide aqueous solution, 30% ammonia aqueous solution and water in a volume ratio of 1:1:10. Thus, the third scribe lines are formed in the transparent conductive film 5 and the rear metal reflection film 6 for pattering thereof. Thus, the rear metal electrode layer is segmented into a plurality of rear electrodes 14 for the respective unit cells. Thus, the integrated thin film solar cells of the single cell structure is completed which are connected in series as shown in FIG. 1.

The integrated thin film solar cells thus fabricated has dimensions of 300 mm×300 mm, and is characterized by a short circuit current of 0.522 A, an open circuit voltage of 26.4 V, a curve factor of 0.72 and a conversion efficiency of 11% with AM1.5 (100 mW/cm$^2$).

EMBODIMENT 2

Figure 3A:
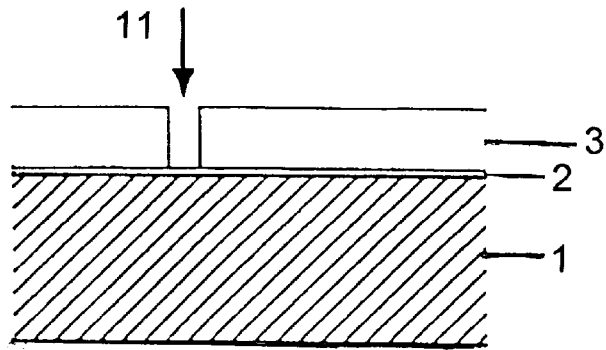
FIG. 3(a) to FIG. 3(d) are schematic sectional views for explaining another method of fabricating integrated thin film solar cells according to the present invention.

A second embodiment of the present invention will be described with reference to FIG. 3. Like the first embodiment, a reinforced glass substrate is used as a transparent substrate 1 having an insulative surface. A silicon dioxide ($SiO_2$) film 2 and a transparent conductive film of tin dioxide ($SnO_2$) are formed on the substrate 1, and the transparent conductive film is subjected to the first scribing step by using a laser beam 11. Thus, the transparent conductive film is segmented into a plurality of transparent conductive film electrodes 3 for unit cells as shown in FIG. 3(a).

Figure 3B:
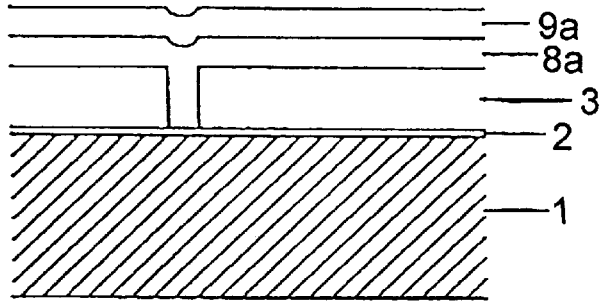

In turn, a first amorphous semiconductor layer 8a is formed on the resulting substrate as shown in FIG. 3(b). More specifically, a 10-nm thick p-layer is formed on the substrate by means of a plasma CVD apparatus (not shown). With the substrate 1 kept at 200° C., monosilane ($SiH_4$) gas, methane ($CH_4$) gas and hydrogen ($H_2$) gas are supplied as reactant gases into the plasma CVD apparatus at flow rates of 30 sccm, 35.6 sccm and 160 sccm, respectively, while diborane ($B_2H_6$) gas diluted into a concentration of 0.6% with hydrogen gas is supplied at a flow rate of 0.06 sccm. At this time, the reaction pressure is kept at 0.32 Torrs.

Subsequently, a 130-nm thick i-layer is formed on the resulting substrate. In the plasma CVD apparatus, the substrate 1 is kept at 200° C., and the reaction pressure is kept at 0.12 Torrs. Monosilane ($SiH_4$) gas and hydrogen ($H_2$) gas are supplied as reactant gases into the plasma CVD apparatus at flow rates of 60 sccm and 20 sccm, respectively.

Further, a 100-nm thick n-layer is formed on the resulting substrate. With the substrate 1 kept at 200° C., monosilane ($SiH_4$) gas and hydrogen ($H_2$) gas are supplied as reactant gases into the plasma CVD apparatus at flow rates of 60 sccm and 20 sccm, respectively, while phosphine ($PH_3$) gas diluted into a concentration of 2% with hydrogen gas is supplied at a flow rate of 0.35 sccm. Thus, the formation of the first amorphous semiconductor photoelectric conversion layer 8 is completed.

In turn, a second amorphous semiconductor layer 9a is formed on the resulting substrate. For formation of the second amorphous semiconductor layer 9a, a p-layer and an i-layer are formed in this order on the resulting substrate 1 under the same conditions as employed for the formation of the first amorphous semiconductor layer 8a. Subsequently, a 100-nm thick n-layer is formed on the resulting substrate.

For the formation of the n-layer, monosilane ($SiH_4$) gas and hydrogen ($H_2$) gas are supplied as reactant gases at flow rates of 30 sccm and 160 sccm, respectively, while phosphine ($PH_3$) gas diluted into a concentration of 0.6% with hydrogen gas is supplied as a dopant gas at a flow rate of 10 sccm. At this time, the reaction pressure is kept at 0.32 Torrs. Thus, the formation of the second amorphous semiconductor layer 9a is completed.

Figure 3C:
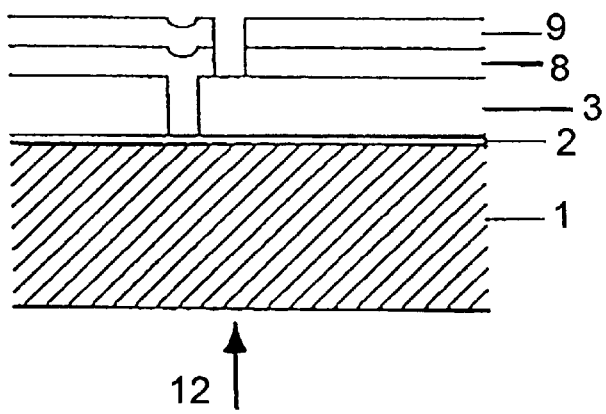

In turn, the first and second amorphous semiconductor layers 8a and 9a are subjected to the second scribing step by irradiation with a laser beam 12. Thus, the first and second amorphous semiconductor layers 8a and 9a are segmented into a plurality of photoelectric conversion layers 8 and 9 for the respective cells as shown in FIG. 3(c).

Figure 3D:
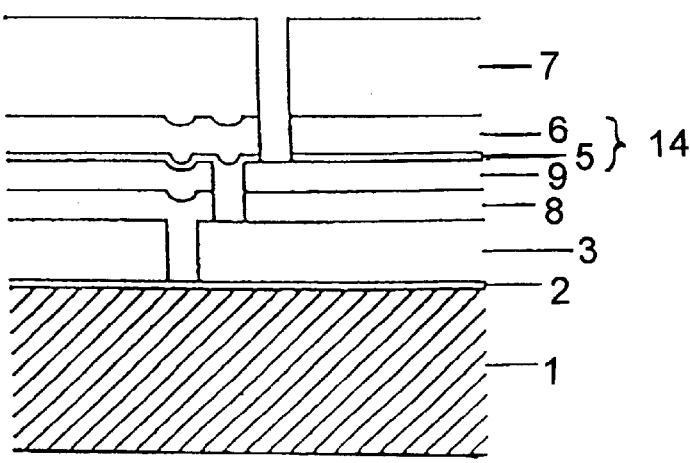

Then, a transparent conductive film 5 and a rear metal reflection film 6 are formed on the resulting substrate 1 as shown in FIG. 3(d). As in the first embodiment, a resist is applied over a surface of the resulting substrate formed with the rear metal reflection film 6 to form a resist film 7, which is then patterned by irradiation with a laser beam. Thereafter, portions of the transparent conductive film 5 and the rear metal reflection film 6 are etched off with an etchant (SC1). Thus, a rear electrode layer consisting of the transparent conductive film 5 and the rear metal reflection film 6 is segmented into a plurality of rear electrodes 14 for the respective cells through the third scribing step.

The integrated thin film solar cells of a double stack tandem structure thus fabricated has dimensions of 300 mm×300 mm, and is characterized by a short circuit current of 0.309 A, an open circuit voltage of 44.4 V, a curve factor of 0.72 and a conversion efficiency of 11% with AM1.5 (100 $mW/cm^2$).

EMBODIMENT 3

A third embodiment of the present invention will be described with reference to FIGS. 2(a) to 2(i). The third embodiment is substantially the same as the first embodiment. Since steps of the third embodiment shown in FIGS. 2(a) to 2(f) are the same as those of the first embodiment, explanation thereto will be omitted.

In the step shown in FIG. 2(g), a rear metal reflection film 6 is formed of aluminum (Al).

Thereafter, a 40-$\mu$m thick resist film 7 is formed of a petroleum pitch plating resist by screen printing as shown in FIG. 2(h). Then, a laser beam 13 of secondary harmonic generation (SHG having a wavelength of 0.532 $\mu$m) from a Q-switch oscillation Nd:YAG laser is applied on the resist film 7 from the top at an oscillation frequency of 5 kHz at a laser emission speed of 40 mm/sec at a process face output of 150 $W/mm^2$ for formation of trenches only in the resist film 7.

Figure 2I:
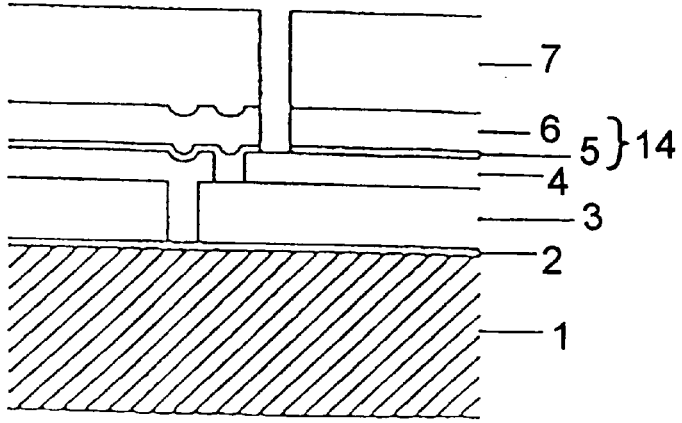

Then, portions of the rear electrode layer consisting of the transparent conductive film 5 and the metal reflection film 6 are etched off with an etchant (SC1) as shown in FIG. 2(i).

EMBODIMENT 4

A fourth embodiment of the present invention will be described. A 1-mm thick glass substrate having a refractive index of 1.5 is used as a transparent substrate having an insulative surface. The substrate is subjected to a sandblasting A method so that a surface of the substrate is textured. Then, zinc oxide is deposited to a thickness of 300 nm on the resulting substrate by sputtering for formation of a transparent conductive film layer.

Thereafter, the steps of the first embodiment are followed for formation of integrated thin film solar cells of the single cell structure. On the other hand, the steps of the second embodiment are followed for formation of integrated thin film solar cells of the tandem structure.

Since the glass substrate is subjected to the texturing treatment, incident light is scattered by the textured surface of the substrate so that the optical path length of light passing through the photoelectric conversion layers is increased. Therefore, the conversion efficiency of the thin film solar cells is improved.

In accordance with the present invention, the rear electrode layer can be segmented by forming narrower trenches through the high precision scribing step utilizing a laser beam, Therefore, a loss in the effective power generation area of the overall integrated solar module can be reduced. Further, the segmentation of the rear electrode layer can assuredly be achieved without damaging the photoelectric conversion layers formed of an amorphous semiconductor by employing the etching process with an etchant. This prevents the reduction in the shunt resistance, and eliminates the cause of the quality degradation of the photoelectric conversion layers. Thus, the characteristics and yield of the integrated thin film solar cells can be improved.

Where the substrate is subjected to the texturing treatment, incident light can be scattered so that the optical path length of light passing through the photoelectric conversion layers is increased. Therefore, the conversion efficiency of the thin film solar cells can be improved.

Since the rear electrode layer has a double layer structure consisting of the transparent conductive film and the metal reflection film, light reflected by the metal reflection film can effectively be utilized.

The rear metal reflection film is formed of silver or aluminum. Therefore, when the trenches are formed in the resist film by irradiation with a laser beam of a predetermined wavelength, the laser beam is reflected by the rear metal reflection film. This prevents the laser beam from influencing the photoelectric conversion layers, and suppresses the local heating of the rear metal reflection film and the photoelectric conversion layer.

What is claimed is:

1. A method of fabricating integrated thin film solar cells, comprising:

a step for forming a transparent conductive film on a transparent substrate having an insulative surface;

a first scribing step for segmenting the transparent conductive film to form transparent conductive film electrodes;

a step for forming an amorphous semiconductor layer on the resulting substrate having the transparent conductive film electrodes;

a second scribing step for segmenting the amorphous semiconductor layer to form amorphous semiconductor photoelectric conversion layers;

a step for forming a rear electrode layer on the resulting substrate having the amorphous semiconductor photoelectric conversion layers; and a third scribing step for segmenting the rear electrode layer to form rear electrodes;

wherein the third scribing step includes forming a resist film on the rear electrode layer, forming trenches in the resist film by laser scribing, and etching off portions of the rear electrode layer with an etchant by using the resulting resist film as a mask.

2. A method of claim 1, wherein the transparent substrate is subjected to a texturing treatment before the formation of the transparent conductive film.

3. A method of claim 1, wherein the rear electrode layer comprises a transparent conductive film and a metal reflection film.

4. A method of claim 3, wherein the metal reflection film is formed of silver; the resist film is formed on the metal reflection film; and then the trenches are formed in the resist film by irradiation with a laser beam having a wavelength of 0.45 μm or greater.

5. A method of claim 3, wherein the metal reflection film is formed of aluminum; the resist film is formed on the metal reflection film; and then the trenches are formed in the resist film by irradiation with a laser beam having a wavelength of 0.10 μm or greater.

6. A method of claim 1, wherein the formation of the resist film is achieved by a screen printing, spray coating or spin coating method.

7. A method of fabricating solar cells, comprising:

successively forming transparent first electrodes, solar cells and second electrodes on the surface of a transparent substrate, wherein said second electrodes are formed by forming a second electrode layer over said solar cells, forming a resist over said second electrode layer, forming trenches in said resist by laser scribing, and etching off portions of said second electrode layer with an etchant using the laser-scribed resist film as a mask.

8. A method of claim 7, wherein said transparent first electrodes are formed by forming a transparent conductive film on the surface of said transparent substrate; and irradiating the transparent conductive film with a laser beam to segment said transparent conductive film.

9. A method of claim 8, wherein said transparent conductive film is formed of one material selected from the group consisting of indium tin oxide, zinc oxide, and tin oxide.

10. A method of claim 7, wherein said solar cells are formed by forming an amorphous semiconductor layer on said transparent first electrodes; and irradiating the amorphous semiconductor layer with a laser beam to segment said amorphous semiconductor layer.

11. A method of claim 10, wherein said amorphous semiconductor layer comprises a p-layer, an i-layer and an n-layer.

12. A method of claim 11, wherein each of said p-layer, said i-layer and said n-layer is amorphous.

13. A method of claim 11, wherein said p-layer is amorphous and said i-layer and said n-layer are crystalline.

14. A method of claim 7, wherein said second electrode layer comprises a transparent conductive film and a reflection film.

15. A method of claim 14, wherein said transparent conductive film is formed of one material selected from the group consisting of indium tin oxide, zinc oxide, and tin oxide.

16. A method according to claim 14, wherein said reflection film is formed of one material selected from the group consisting of silver and aluminum.

17. A method according to claim 7, wherein the surface of said transparent substrate is textured prior to forming said transparent conductive electrodes.

* * * * *